United States Patent
Lee et al.

(10) Patent No.: US 10,181,276 B2
(45) Date of Patent: Jan. 15, 2019

(54) GATE DRIVING CIRCUIT AND DISPLAY DEVICE INCLUDING THE SAME

(71) Applicant: LG Display Co., Ltd., Seoul (KR)

(72) Inventors: Ju-Young Lee, Paju-Si (KR); Seung-Wan Cho, Paju-Si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/872,773

(22) Filed: Oct. 1, 2015

(65) Prior Publication Data
US 2016/0171915 A1 Jun. 16, 2016

(30) Foreign Application Priority Data
Dec. 10, 2014 (KR) .................. 10-2014-0177485

(51) Int. Cl.
*G09G 3/36* (2006.01)
*G11C 27/04* (2006.01)
(Continued)

(52) U.S. Cl.
CPC ............. *G09G 3/20* (2013.01); *G09G 3/3266* (2013.01); *G09G 3/3677* (2013.01); *G11C 19/28* (2013.01); *G09G 2300/0408* (2013.01); *G09G 2300/0871* (2013.01); *G09G 2310/0286* (2013.01); *G09G 2310/08* (2013.01); *G09G 2330/021* (2013.01); *G09G 2330/04* (2013.01)

(58) Field of Classification Search
CPC .. G09G 3/3223; G09G 3/3266; G09G 3/3677; G09G 2130/0286; G09G 2130/0289; G09G 2300/0871; G11C 19/28
See application file for complete search history.

(56) References Cited

U.S. PATENT DOCUMENTS 6,295,046 B1    9/2001   Hebiguchi
2005/0099068 A1*  5/2005  Kimura ............ H03K 19/01728
                                                                 307/112
(Continued)

FOREIGN PATENT DOCUMENTS

CN     1841565    10/2006
CN    101762918    6/2010

OTHER PUBLICATIONS

European Partial Search Report, European Application No. 15191428.0, dated Apr. 13, 2016, 8 pages.
(Continued)

*Primary Examiner* — Xuemei Zheng
(74) *Attorney, Agent, or Firm* — Fenwick & West LLP

(57) ABSTRACT

A gate driving circuit sequentially outputting a gate voltage using a high level power voltage, a low level power voltage, a start voltage, a previous stage gate voltage, a next stage gate voltage and a clock, includes: a shift register including a plurality of stages connected to each other by a cascade connection, each of the plurality of stages including: a first thin film transistor (TFT) switched by the start voltage or the previous stage gate voltage and transmitting the high level power voltage to a Q node; a second TFT switched by the next stage gate voltage and transmitting the low level power voltage to the Q node; a third TFT switched by a voltage of the Q node and transmitting the clock to an output node; and a first resistor connected between the output node and the low level power voltage.

13 Claims, 17 Drawing Sheets

(51) Int. Cl.
G09G 3/20 (2006.01)
G09G 3/3266 (2016.01)
G11C 19/28 (2006.01)

(56) References Cited

U.S. PATENT DOCUMENTS

2005/0212746 A1    9/2005    Iwasaki et al.
2008/0088555 A1    4/2008    Shin et al.
2010/0156862 A1*   6/2010    Kim ..................... G09G 3/3677
                                                    345/206
2010/0231492 A1*   9/2010    Moon .................. G09G 3/3677
                                                    345/87
2010/0302230 A1    12/2010   Moon et al.

OTHER PUBLICATIONS

First Office Action for Chinese Patent Application No. CN 201510713077.8, dated Jan. 22, 2018, 16 Pages (With English Translation).
European Patent Office, Communication Pursuant to Article 94(3) EPC, EP Patent Application No. 15191428.0, nine pages.

* cited by examiner

SRS

SRS

SRS

GATE DRIVING CIRCUIT AND DISPLAY DEVICE INCLUDING THE SAME

CROSS-REFERENCE TO RELATED APPLICATIONS

This application claims the benefit under 35 U.S.C. § 119(a) of Korean Patent Application No. 10-2014-0177485, filed on Dec. 10, 2014, in the Korean Intellectual Property Office, which is incorporated herein by reference in its entirety.

BACKGROUND

1. Technical Field

The present disclosure relates to a gate driving circuit, and more particularly, to a gate driving circuit including a shift register and a display device including the gate driving circuit.

2. Discussion of the Related Art

Recently, as the information society progresses, display devices processing and displaying a large amount of information have rapidly advanced and various flat panel displays (FPDs) have been developed. For example, the FPDs may include liquid crystal display (LCD) devices, plasma display panel (PDP) devices, organic light emitting diode (OLED) display devices and field emission display (FED) devices.

In general, a display device includes a display panel displaying an image and a driving unit supplying a signal and a power to the display panel. The driving unit includes a gate driving unit and a data driving unit supplying a gate voltage and a data voltage, respectively, to a pixel region of the display panel.

The driving unit may be formed as a printed circuit board (PCB), and PCBs for the gate driving unit and the data driving unit are attached to a pad region at the periphery of the display panel. However, when the PCBs for the gate driving unit and the data driving unit are attached to a pad region of the display panel, a volume and a weight of the display device increase.

Accordingly, a gate-in-panel (GIP) type display device where a part of the gate driving unit such as a shift register is formed on an array substrate of the display panel and a single PCB including the other part of the gate driving unit and the data driving unit is attached to the display panel has been suggested.

The GIP type display device will be illustrated referring to drawings.

FIG. 1 is a view showing a stage of a shift register of a gate-in-panel type display device according to the related art, and FIG. 2 is a timing chart showing a plurality of signals for a shift register of a gate-in-panel type display device according to the related art.

In FIGS. 1 and 2, a shift register of a gate-in-panel (GIP) type display device according to the related art includes a plurality of stages SRS and generates a gate voltage VG supplied to a display panel using a high level power voltage VDD, a low level power voltage VSS, a start voltage VST, a next stage gate voltage VNEXT and a clock CLK. Each stage SRS of the shift register includes first to ninth thin film transistors (TFTs) T1 to T9.

The gate voltage VG is outputted from a node between a source of the eighth TFT T8 and a drain of the ninth TFT T9. The clock CLK is applied to a drain of the eighth TFT T8, and the low level power voltage VSS is applied to a source of the ninth TFT T9. Accordingly, the clock CLK is outputted as the gate voltage VG while the eighth TFT T8 is turned on, and the low level power voltage VSS is outputted as the gate voltage VG while the ninth TFT T9 is turned on.

Voltages of gates of the eighth and ninth TFTs T8 and T9 are determined by first to seventh TFTs T1 to T7 and the start voltage VST. During a first time section TS1, since a high level voltage is applied to a Q node and the gate of the eighth TFT T8 to turn on the eighth TFT T8, a low level voltage of the clock CLK is outputted as the gate voltage VG. During a second time section TS2, since a high level voltage of the clock CLK is applied to the drain of the eighth TFT T8 and the high level voltage of the gate of the eighth TFT T8 becomes a higher level voltage by boosting to turn on the eighth TFT T8, the high level voltage of the clock CLK is outputted as the gate voltage VG.

During a third time section TS3, since a high level voltage is applied to the Q node and the gate of the eighth TFT T8 to turn on the eighth TFT T8, the low level voltage of the clock CLK is outputted as the gate voltage VG. During the first to third time sections TS1 to TS3, a low level voltage is applied to a QB node and gates of the third and ninth TFTs T3 and T9, and the third and ninth TFTs T3 and T9 maintain a turn-off state.

During a fourth time section TS4, since a low level voltage is applied to the Q node and the gate of the eighth TFT T8 to turn off the eighth TFT T8 and a high level voltage is applied to the QB node and the gates of the third and ninth TFTs T3 and T9 to turn on the third and ninth TFTs T3 and T9, the low level power voltage VSS is outputted as the gate voltage VG.

In each stage of the shift register according to the related art, the eighth TFT T8 is turned on during the first to third time sections TS1 to TS3 corresponding to three horizontal periods 3H of one frame 1F and is turned off during the other fourth time section T4, while the third and ninth TFTs T1 and T9 are turned off during the first to third time sections TS1 to TS3 corresponding to three horizontal periods 3H of one frame 1F and are turned on during the other fourth time section T4.

Accordingly, the shift register may not normally operate due to deterioration of the third and ninth TFTs T3 and T9. To solve the above problems, a method of improving reliability by dividing a turn-on time of the ninth TFT T9 has been suggested. However, since the above method has a limit that a turn-on time of the ninth TFT T9 does not absolutely decrease, the above method is not applied to a display device requiring high reliability.

SUMMARY

Embodiments of the present disclosure relate to a gate driving circuit. Accordingly, one embodiment is directed to a gate driving circuit and a display device including the gate driving circuit that substantially obviate one or more of the problems due to limitations and disadvantages of the related art.

One embodiment is a gate driving circuit and a display device including the gate driving circuit where deterioration of a thin film transistor is prevented and reliability of a shift register is improved by substituting a pull-down thin film transistor with a resistor.

In addition, one embodiment is a gate driving circuit and a display device including the gate driving circuit where deterioration of a thin film transistor is prevented and reliability of a shift register is improved by substituting a pull-down thin film transistor with a resistor, a thin film transistor and a capacitor.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one embodiment is a gate driving circuit sequentially outputting a gate voltage using a high level power voltage, a low level power voltage, a start voltage, a previous stage gate voltage, a next stage gate voltage and a clock, including: a shift register including a plurality of stages connected to each other by a cascade connection, each of the plurality of stages including: a first thin film transistor (TFT) switched by the start voltage or the previous stage gate voltage and transmitting the high level power voltage to a Q node; a second TFT switched by the next stage gate voltage and transmitting the low level power voltage to the Q node; a third TFT switched by a voltage of the Q node and transmitting the clock to an output node; and a first resistor connected between the output node and the low level power voltage.

In another aspect, one embodiment is a display device including: a timing controlling unit generating a gate control signal, a data control signal and an image data; a data driving unit generating a data voltage using the data control signal and the image data; a gate driving unit generating a gate voltage using the gate control signal; and a display panel displaying an image using the gate voltage and the data voltage, wherein the gate driving unit sequentially outputting the gate voltage using a high level power voltage, a low level power voltage, a start voltage, a previous stage gate voltage, a next stage gate voltage and a clock, wherein the gate driving unit includes a shift register including a plurality of stages connected to each other by a cascade connection, wherein each of the plurality of stages includes: a first thin film transistor (TFT) switched by the start voltage or the previous stage gate voltage and transmitting the high level power voltage to a Q node; a second TFT switched by the next stage gate voltage and transmitting the low level power voltage to the Q node; a third TFT switched by a voltage of the Q node and transmitting the clock to an output node; and a first resistor connected between the output node and the low level power voltage.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
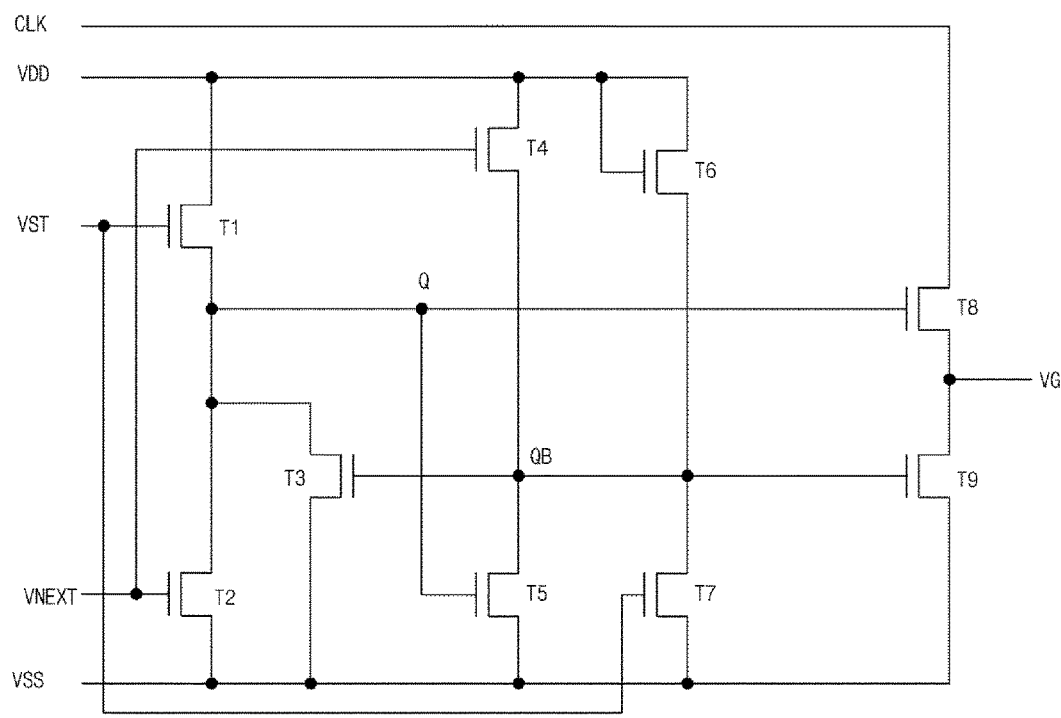
FIG. 1 is a view showing a stage of a shift register of a gate-in-panel type display device according to the related art.
Figure 2:
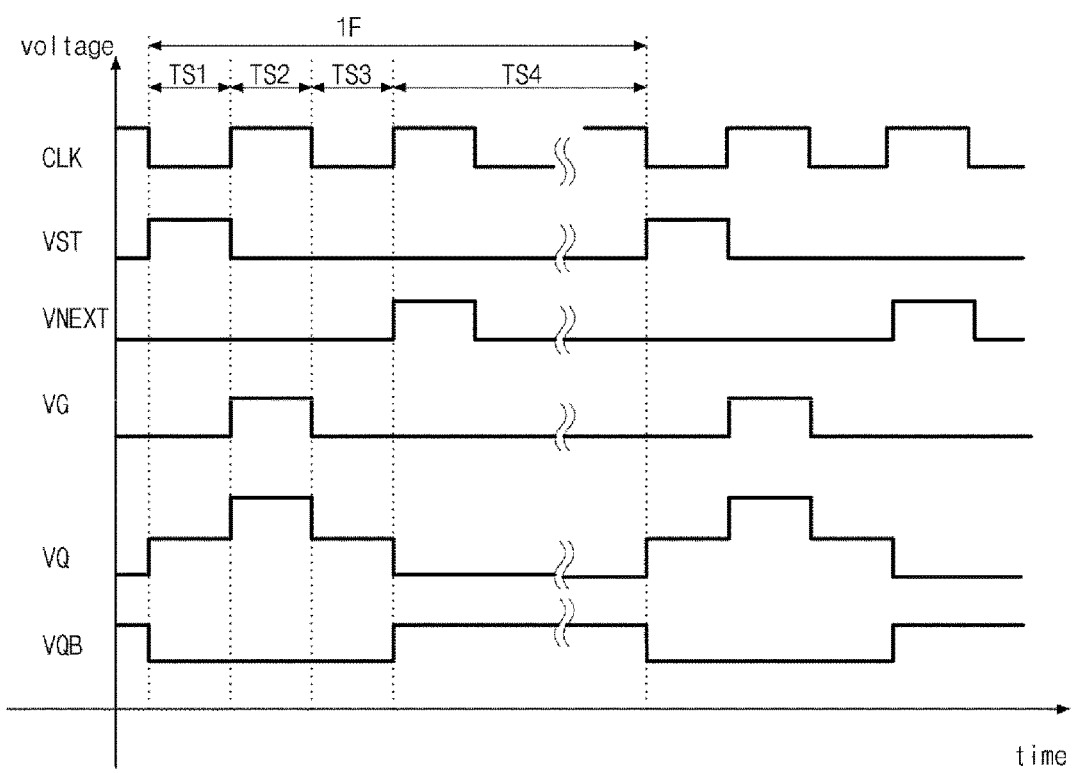
FIG. 2 is a timing chart showing a plurality of signals for a shift register of a gate-in-panel type display device according to the related art.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 3:
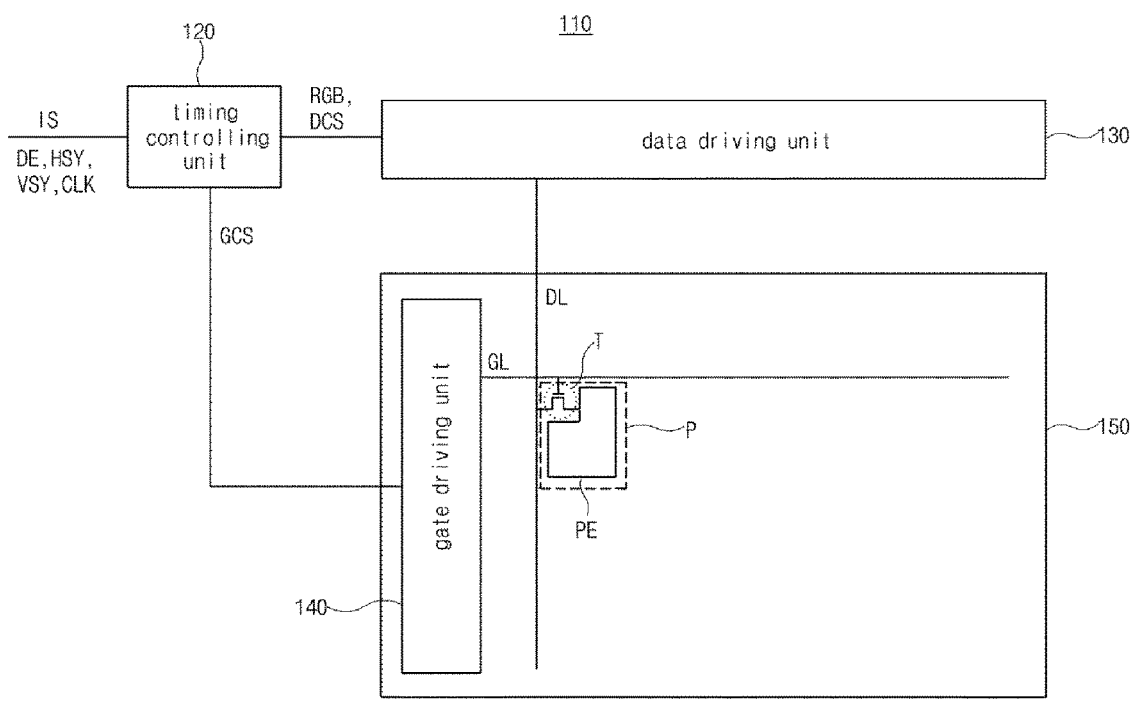
FIG. 3 is a view showing a display device according to a first embodiment of the present disclosure.

FIG. 3 is a view showing a display device according to a first embodiment of the present disclosure.

In FIG. 3, a gate-in-panel (GIP) type display device 110 according to a first embodiment of the present disclosure includes a timing controlling unit 120, a data driving unit 130, a gate driving unit 140 and a display panel 150.

The timing controlling unit 120 generates a gate control signal GCS, a data control signal DCS and image data RGB using a plurality of timing signals such as an image signal IS from an external system such as a graphic card or a television system, a data enable signal DE, a horizontal synchronization signal HSY, a vertical synchronization signal VSY and a clock CLK. The timing controlling unit 120 supplies the data control signal DCS and the image data RGB to the data driving unit 130 and supplies the gate control signal GCS to the gate driving unit 140.

The data driving unit 130 generates a data voltage using the data control signal DCS and the image data RGB from the timing controlling unit 120 and supplies the data voltage to a data line DL of the display panel 150.

The gate driving unit 140 generates a gate voltage using the gate control signal GCS from the timing controlling unit 120 and supplies the gate voltage to a gate line GL of the display panel 150. The gate driving unit 140 may have a gate-in-panel (GIP) type where a part of the gate driving unit 140 is formed on an array substrate having the gate line GL, the data line DL and a thin film transistor (TFT) T thereon.

The display panel 150 displays an image using the gate voltage and the data voltage. The display panel 150 includes the gate line GL and the data line DL crossing each other to define a pixel region P, the TFT T connected to the gate line GL and the data line DL and a pixel electrode PE connected to the TFT T. When the gate voltage from the gate driving unit 140 is applied to the TFT T through the gate line GL, the TFT T is turned on and the data voltage from the data driving unit 130 is applied to the pixel electrode PE through the data line DL and the TFT T.

The display panel 150 may be one of a liquid crystal (LC) panel and an organic light emitting diode (OLED) panel. When the display panel 150 is an LC panel, a gray level is displayed by adjusting transmittance of a liquid crystal layer between the pixel electrode PE and a common electrode. When the display panel 150 is an OLED panel, a gray level is displayed by adjusting an output of a light emitting diode connected to the pixel electrode PE.

The gate driving unit 140 includes a shift register which is formed through a process the same as that for the TFT T in the pixel region P.

Figure 4:
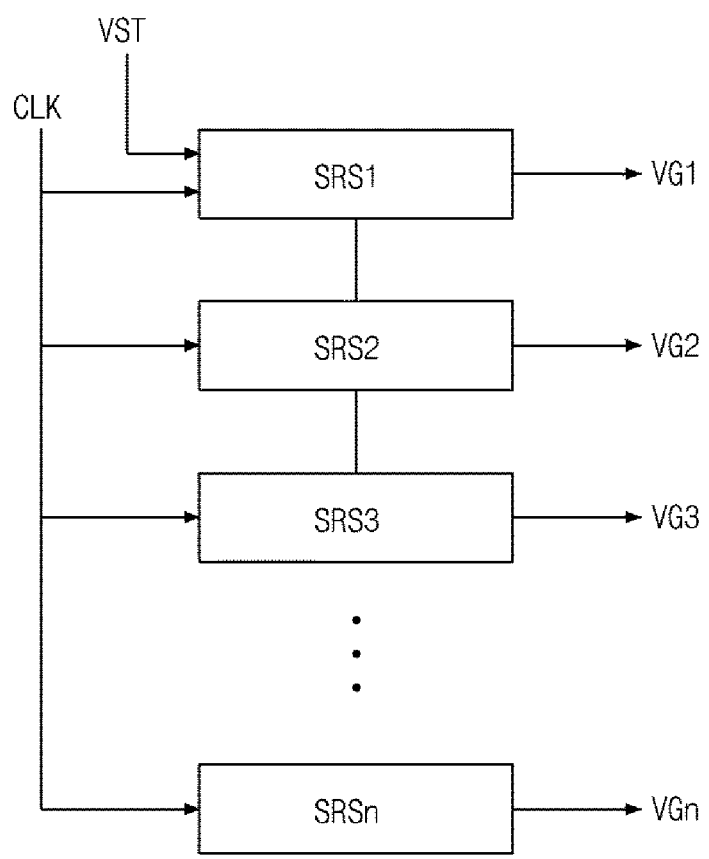
FIG. 4 is a view showing a shift register of a gate driving unit according to a first embodiment of the present disclosure.
Figure 5:
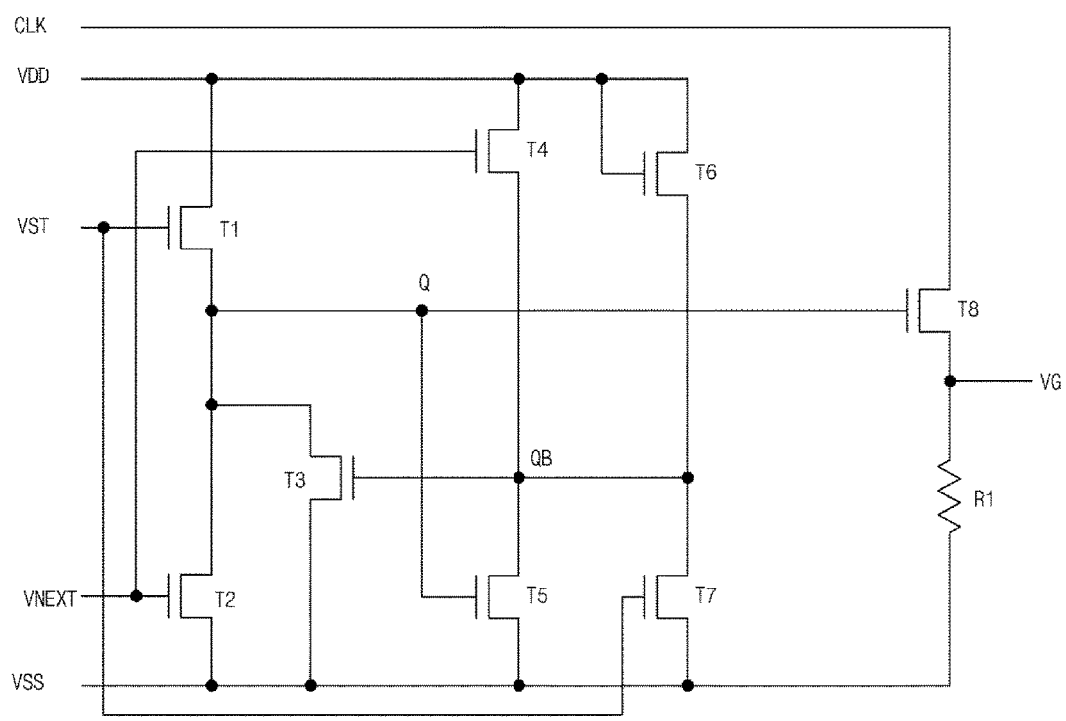
FIG. 5 is a view showing one stage of a shift register according to a first embodiment of the present disclosure.
Figure 6:
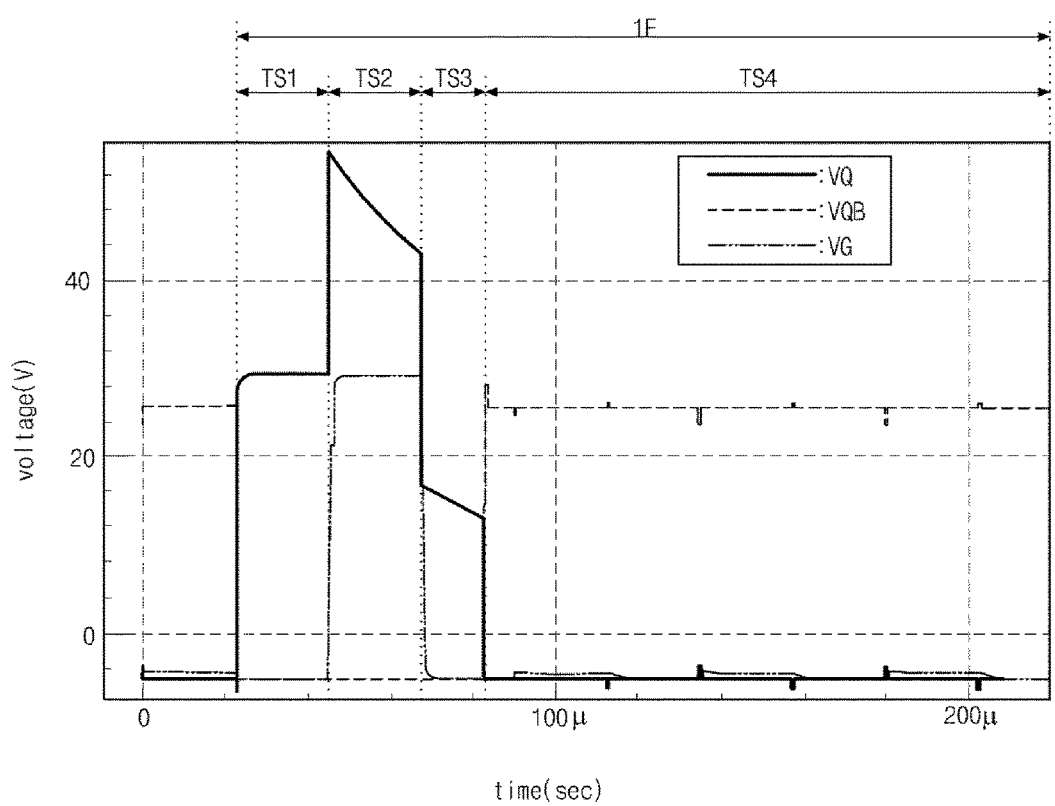
FIG. 6 is a view showing a Q node voltage, a QB node voltage and a gate voltage of a shift register according to a first embodiment of the present disclosure.

FIG. 4 is a view showing a shift register of a gate driving unit according to a first embodiment of the present disclosure, FIG. 5 is a view showing one stage of a shift register according to a first embodiment of the present disclosure, and FIG. 6 is a view showing a Q node voltage, a QB node voltage and a gate voltage of a shift register according to a first embodiment of the present disclosure.

In FIG. 4, the gate driving unit 140 (of FIG. 3) of the GIP type display device 110 (of FIG. 3) according to a first embodiment of the present disclosure includes a shift register SR, and the shift register SR includes a plurality of stages SRS1 to SRSn connected to each other by a cascade connection.

Among the plurality of stages SRS1 to SRSn, a first stage SRS1 outputs a first gate voltage VG1 using a clock CLK according to a start voltage VST, and second to nth stages sequentially outputs second to nth gate voltages VG2 to VGn using a plurality of clocks CLKs according to an output voltage of a previous stage or an output voltage of a next stage.

In FIG. 5, each stage SRS of a shift register SR of a gate driving unit 140 (of FIG. 3) of a GIP type display device 110 (of FIG. 3) according to a first embodiment of the present disclosure generates a gate voltage VG supplied to a display panel 150 (of FIG. 3) using a high level power voltage VDD, a low level power voltage VSS, a start voltage VST, a next stage gate voltage VNEXT and a clock CLK. Each stage SRS of the shift register SR includes first to eighth thin film transistors (TFTs) T1 to T8 and a first resistor R1.

A terminal of the first to eighth TFTs T1 to T8 adjacent to the high level power voltage VDD may be referred to as a drain and a terminal of the first to eighth TFTs T1 to T8 adjacent to the low level power voltage VSS may be referred to as a source. The start voltage VST and the high level power voltage VDD are applied to the gate and the drain, respectively, of the first TFT T1, and the source of the first TFT T1 is connected to the drain of the second TFT T2, the drain of the third TFT T3 and the gate of the eighth TFT T8 to constitute a Q node. The next stage gate voltage VNEXT and the low level power voltage VSS are applied to the gate and the source, respectively, of the second TFT T2, and the drain of the second TFT T2 is connected to the Q node.

The low level power voltage VSS is applied to the source of the third TFT T3, the drain of the third TFT T3 is connected to the Q node, and the gate of the third TFT T3 is connected to the source of the fourth TFT T4, the drain of the fifth TFT T5, the source of the sixth TFT T6 and the drain of the seventh TFT T7 to constitute a QB node. The next stage gate voltage VNEXT and the high level power voltage VDD are applied to the gate and the drain, respectively, of the fourth TFT T4, and the source of the fourth TFT T4 is connected to the QB node.

The low level power voltage VSS is applied to the source of the fifth TFT T5, and the gate and the drain of the fifth TFT T5 are connected to the Q node and the QB node, respectively. The high level power voltage VDD is applied to the gate and the drain of the sixth TFT T6, and the source of the sixth TFT T6 is connected to the QB node.

The start voltage VST and the low level power voltage VSS are applied to the gate and the source, respectively, of the seventh TFT T7, and the drain of the seventh TFT T7 is connected to the QB node. The clock CLK is applied to the drain of the eighth TFT T8, the gate of the eighth TFT T8 is connected to the Q node, and the source of the eighth TFT T8 is connected to a first end of the first resistor R1 to output the gate voltage VG.

The first end of the resistor R1 is connected to the source of the eighth TFT T8, and a second end of the resistor R1 is connected to the low level power voltage VSS. The start voltage VST may be applied to the first stage SRS1 (of FIG. 4), and a previous stage gate voltage may be applied to the second to nth stages SRS2 to SRSn (of FIG. 4).

In the stage SRS of the shift register SR, the gate voltage VG is outputted from a node between the source of the eighth TFT T8 and the first resistor R1. A high level voltage of the clock CLK is outputted as the gate voltage VG (VGH) while the eighth TFT T8 is turned on, and a voltage higher than the low level power voltage VSS by a voltage rise in the first resistor R1 (VSS+IR1) is outputted as the gate voltage VG (VGL) while the eighth TFT T8 is turned off. Accordingly, in each stage SRS of the shift register SR according to a first embodiment of the present disclosure, the eighth TFT T8 as a pull-up TFT outputs the gate voltage VG of a high level, while a pull-down TFT is omitted and the first resistor R1 outputs the gate voltage VG of a low level.

To output the gate voltage VG of a low level stably, a resistance of the first resistor R1 may be the same as a turn-on resistance of the eighth TFT T8. For example, the first resistor R1 may have a resistance of about 1 kΩ to about 1000 kΩ.

In each stage SRS of the shift register SR, since a pull-down TFT which is turned on for most of one frame 1F is omitted, an abnormal operation of the shift register SR due to deterioration of the pull-down TFT for the gate voltage VG is prevented and reliability of the gate driving circuit is improved.

In FIG. 6, during a first time section TS1, since a high level voltage is applied to the Q node and the gate of the eighth TFT T8 to turn on the eighth TFT T8, a low level voltage of the clock CLK is outputted as the gate voltage VG. During a second time section TS2, since a high level voltage of the clock CLK is applied to the drain of the eighth TFT T8 and the high level voltage of the gate of the eighth TFT T8 becomes a higher level voltage by boosting to turn on the eighth TFT T8, the high level voltage of the clock CLK is outputted as the gate voltage VG.

During a third time section TS3, since a high level voltage is applied to the Q node and the gate of the eighth TFT T8 to turn on the eighth TFT T8, the low level voltage of the clock CLK is outputted as the gate voltage VG. During the first to third time sections TS1 to TS3, a low level voltage is applied to a QB node and the gate of the third TFT T3, and the third TFT T3 maintains a turn-off state.

During a fourth time section TS4, since a low level voltage is applied to the Q node and the gate of the eighth TFT T8 to turn off the eighth TFT T8 and a high level voltage is applied to the QB node and the gate of the third TFT T3 to turn on the third TFT T3, the Q node maintains the low level power voltage VSS.

In the shift register SR, a current is consumed through the first resistor R1 while the eighth TFT T8 is turned on.

Figure 7:
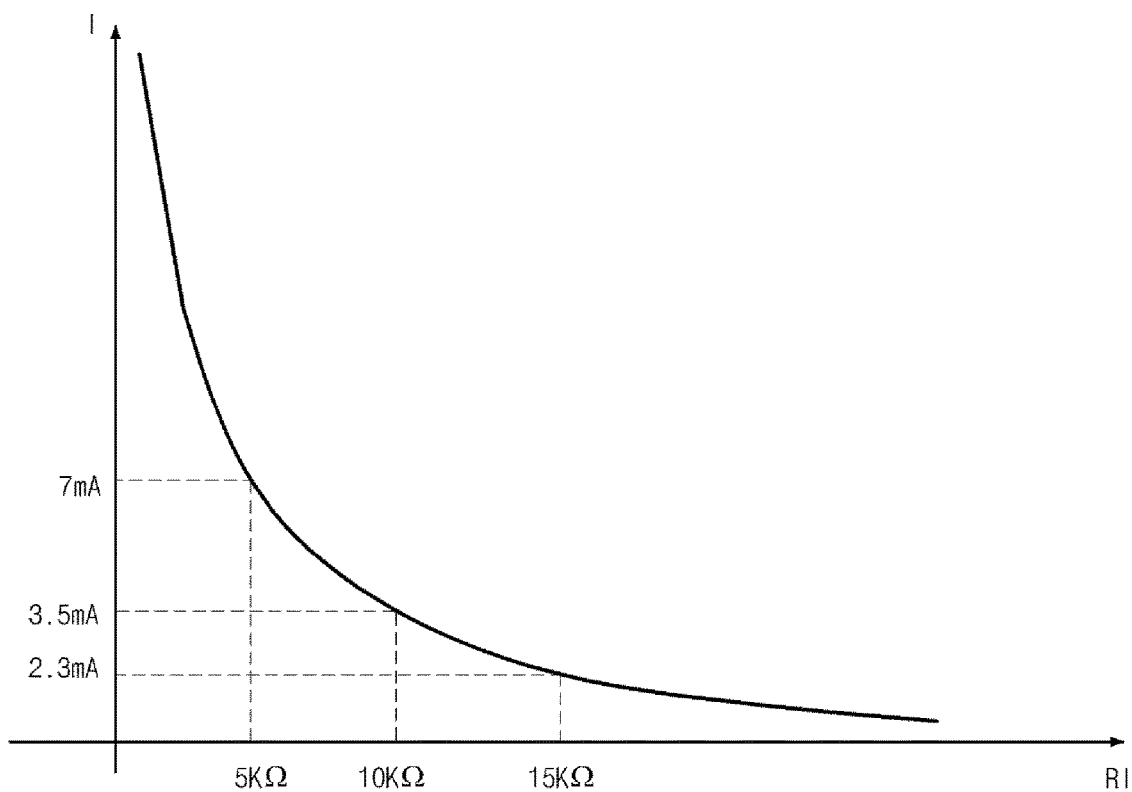
FIG. 7 is a view showing a current consumption in each stage of a shift register according to a first embodiment of the present invention.

FIG. 7 is a view showing a current consumption in each stage of a shift register according to a first embodiment of the present invention.

In FIG. 7, a current flows through the first resistor R1 (of FIG. 5) to be consumed during the second time section TS2 (of FIG. 6) where the high level voltage is outputted as the gate voltage VG (of FIG. 5). For example, when the high level power voltage VDD (of FIG. 5) and the low level power voltage VSS (of FIG. 5) are about 30V and about −5V, respectively, a current I flowing through the first resistor R1 during the second time section TS2 may be determined by I=(30−(−5))/R1. When the first resistor R1 is about 5 kΩ, about 10 kΩ and about 15 kΩ, a current of about 7 mA, about 3.5 mA and about 2.3 mA, respectively, may be consumed. As a result, the current consumption may not affect the operation of the display device.

In addition, since the second time section TS2 is one horizontal period 1H or two to three horizontal periods 2H to 3H in a gate voltage overlap driving where a turn-on voltage is applied to two or more gate lines, the current consumption may not affect the operation of the display device even in the gate voltage overlap driving.

The first resistor R1 may be formed directly on the display panel 150 (of FIG. 3) with the gate driving unit 140 (of FIG. 3).

Figure 8:
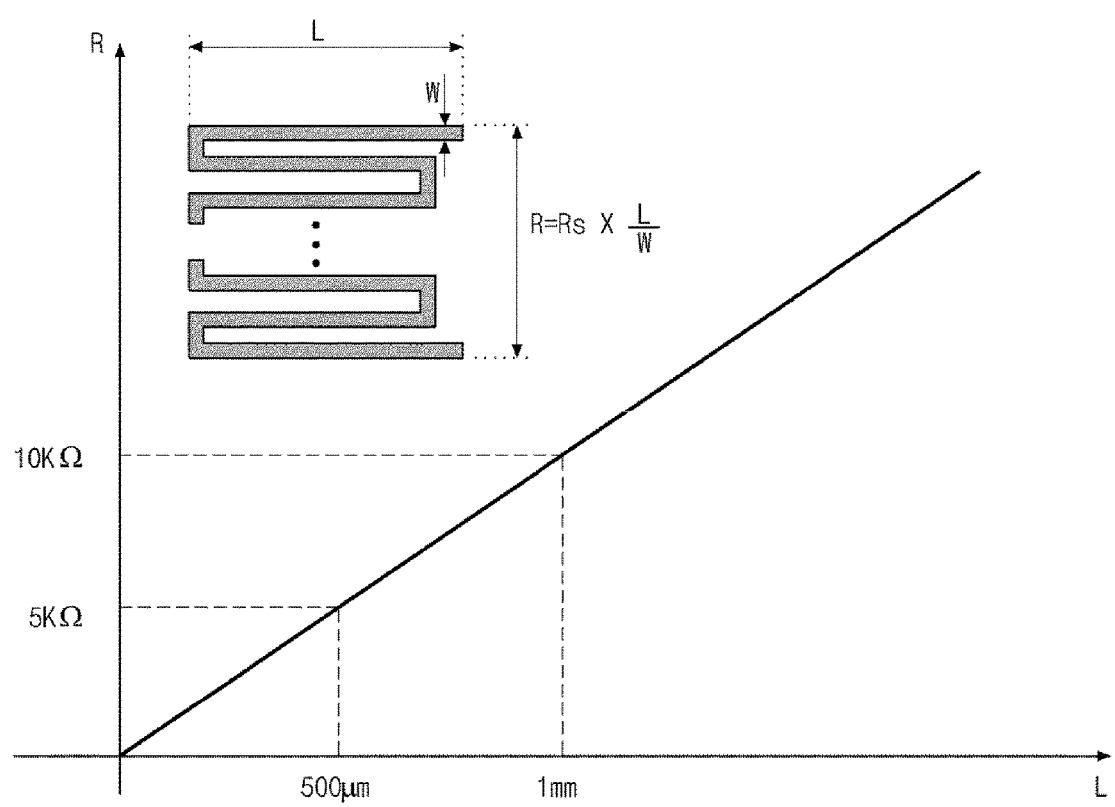
FIG. 8 is a view showing a first resistor of a shift register according to a first embodiment of the present disclosure.

FIG. 8 is a view showing a first resistor of a shift register according to a first embodiment of the present disclosure.

In FIG. 8, a first resistor R1 may be formed of a conductive layer having a relatively high resistance on the display panel 150 (of FIG. 3). For example, the first resistor R1 may be formed of a transparent conductive material such as indium tin oxide (ITO) for the pixel electrode PE (of FIG. 3). A total resistance R of an ITO pattern having a sheet resistance Rs of about 100 Ω/sq and a width of about 10 μm is determined by R=Rs(L/W)=100Ω(L/10 μm). When a length L of the ITO pattern is about 500 μm and about 1 mm, the ITO pattern having a resistance of about 5 kΩ and about 10 kΩ a respectively, may be used as the first resistor R1.

In the shift register SR according to the first embodiment of the present disclosure, while the eighth TFT T8 is turned on and a high level voltage is outputted as the gate voltage VG, the gate voltage VG may become lower than the high level power voltage VDD due to voltage distribution between a turn-on resistance of the eighth TFT T8 and the first resistor R1. To increase the gate voltage VG, the first resistor R1 may be divided into two resistors and difference voltages are applied to a node between the two resistors according to the time sections in another embodiment.

Figure 9:
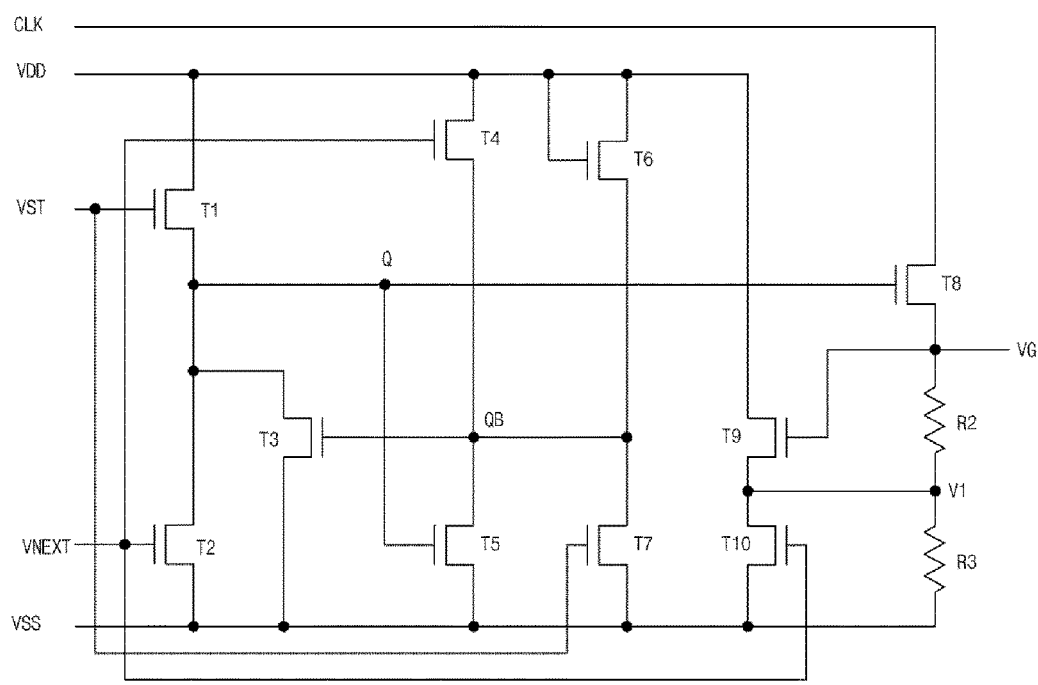
FIG. 9 is a view showing one stage of a shift register according to a second embodiment of the present disclosure.
Figure 10:
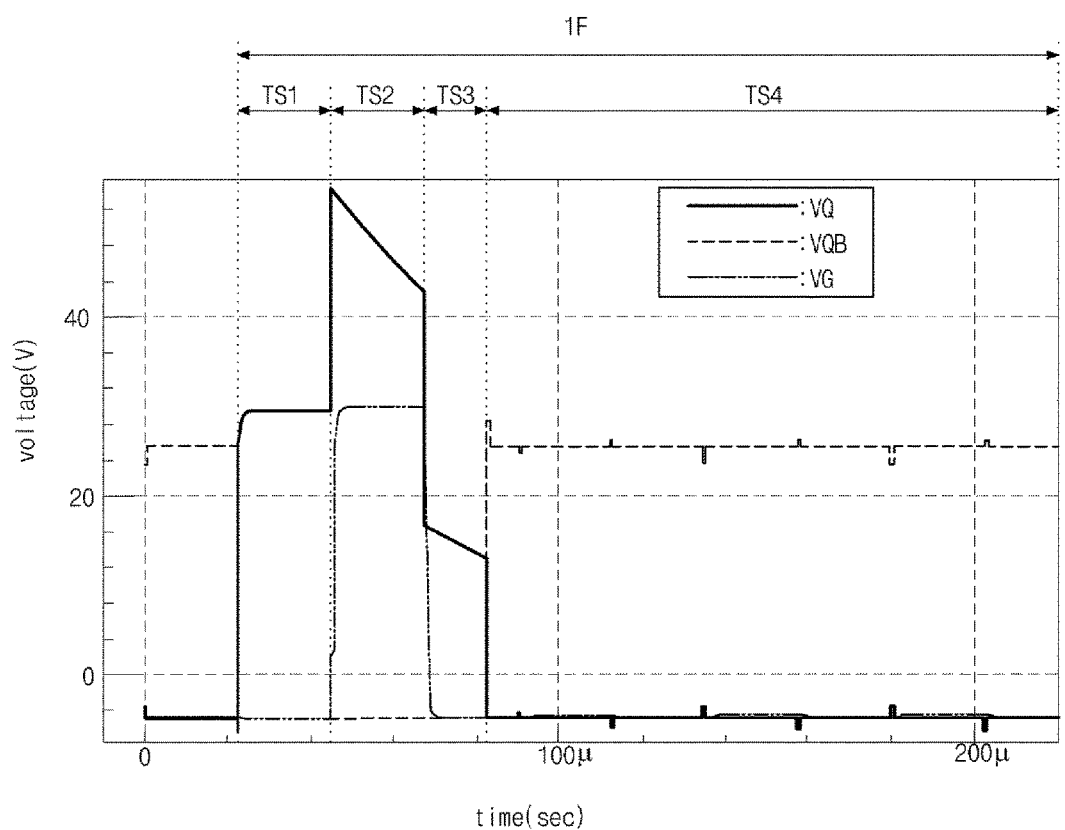
FIG. 10 is a view showing a Q node voltage, a QB node voltage and a gate voltage of a shift register according to a second embodiment of the present disclosure.

FIG. 9 is a view showing one stage of a shift register according to a second embodiment of the present disclosure, and FIG. 10 is a view showing a Q node voltage, a QB node voltage and a gate voltage of a shift register according to a second embodiment of the present disclosure. Illustrations for parts the same as those of the first embodiment will be omitted.

In FIG. 9, a shift register of a gate driving unit of a GIP type display device according to a second embodiment of the present disclosure generates a gate voltage VG supplied to a display panel using a high level power voltage VDD, a low level power voltage VSS, a start voltage VST, a next stage gate voltage VNEXT and a clock CLK. Each stage SRS of the shift register includes first to tenth thin film transistors (TFTs) T1 to T10 and second and third resistors R2 and R3.

The connections between the first to eighth TFTs T1 to T8 are the same as those of the first embodiment. The high level power voltage VDD is applied to the drain of the ninth TFT T9, the gate of the ninth TFT T9 is connected to the source of the eighth TFT T8 and a first end of the second resistor R2, and the source of the ninth TFT T9 is connected to the drain of the tenth TFT T10, a second end of the second resistor R2 and a first end of the third resistor R3.

The next stage gate voltage VNEXT and the low level power voltage VSS are applied to the gate and the source, respectively, of the tenth TFT T10, and the drain of the tenth TFT T10 is connected to the source of the ninth TFT T9, the second end of the second resistor R2 and the first end of the third resistor R3.

The first end of the second resistor R2 is connected to the source of the eighth TFT T8, the second end of the second resistor R2 is connected to the first end of the third resistor R3 to constitute a first node having a first voltage V1, and the second end of the third resistor R3 is connected to the low level power voltage VSS. The start voltage VST may be applied to the first stage, and a previous stage gate voltage may be applied to the second to nth stages.

In the stage SRS of the shift register, the gate voltage VG is outputted from a node between the source of the eighth TFT T8 and the second resistor R2. A high level voltage of the clock CLK is outputted as the gate voltage VG (VGH) while the eighth TFT T8 is turned on, and a voltage higher than the low level power voltage VSS by a voltage rise in the second and third resistors R2 and R3 (VSS+IR2+IR3) is outputted as the gate voltage VG (VGL) while the eighth TFT T8 is turned off. Accordingly, in each stage SRS of the shift register according to a second embodiment of the present disclosure, the eighth TFT T8 as a pull-up TFT outputs the gate voltage VG of a high level voltage, while a pull-down TFT is omitted and the second and third resistors R2 and R3 output the gate voltage VG of a low level voltage.

In each stage SRS of the shift register, since a pull-down TFT which is turned on for most of one frame 1F is omitted, an abnormal operation of the shift register due to deterioration of the pull-down TFT for the gate voltage VG is prevented and reliability of the gate driving circuit is improved.

In addition, since the ninth TFT T9 is turned on while the eighth TFT T8 is turned on to output high level voltage as the gate voltage VG, the first voltage V1 of the first node between the second and third resistors R2 and R3 rises up to the high level power voltage VDD. As a result, voltage drop of the gate voltage VG is prevented and reliability of the gate driving circuit is further improved.

The first voltage V1 is determined by a turn-on resistance of the ninth TFT T9 and the second and third resistors R2 and R3. The turn-on resistance of the ninth TFT T9 may be minimized and the second and third resistors R2 and R3 may be maximized so that the first voltage V1 can have an approximate value to the gate voltage VG of a high level voltage.

To output the gate voltage VG of a high level voltage more stably, a voltage higher than the high level power voltage VDD may be applied to the ninth TFT T9. When the eighth TFT T8 is turned off and the gate voltage VG is changed from a high level voltage to a low level voltage, the ninth TFT T9 is turned off and the tenth TFT T10 is turned on. Accordingly, the gate voltage VG reaches the low level voltage faster and the stage SRS of the shift register outputs the gate voltage more stably.

In FIG. 10, during a first time section TS1, since a high level voltage is applied to the Q node and the gate of the eighth TFT T8 to turn on the eighth TFT T8, a low level voltage of the clock CLK is outputted as the gate voltage VG. During a second time section TS2, since a high level voltage of the clock CLK is applied to the drain of the eighth TFT T8 and the high level voltage of the gate of the eighth TFT T8 becomes a higher level voltage by boosting to turn on the eighth TFT T8, the high level voltage of the clock CLK is outputted as the gate voltage VG. In addition, since the high level voltage is applied to the gate of the ninth TFT T9 to turn on the ninth TFT T9, the first voltage V1 of the first node between the second and third resistors R2 and R3 becomes the high level power voltage VDD.

During a third time section TS3, since a high level voltage is applied to the Q node and the gate of the eighth TFT T8 to turn on the eighth TFT T8, the low level voltage of the clock CLK is outputted as the gate voltage VG. In addition, since the next stage gate voltage VNEXT is applied to the gate of the tenth TFT T10 to turn on the tenth TFT T10, the first voltage V1 becomes the low level power voltage VSS. During the first to third time sections TS1 to TS3, a low level voltage is applied to a QB node and the gate of the third TFT T3, and the third TFT T3 maintains a turn-off state.

During a fourth time section TS4, since a low level voltage is applied to the Q node and the gate of the eighth TFT T8 to turn off the eighth TFT T8 and a high level voltage is applied to the QB node and the gate of the third TFT T3 to turn on the third TFT T3, the Q node maintains the low level power voltage VSS.

In the shift register according to a second embodiment of the present disclosure, since the third TFT T3 maintains a turn-on state for most of one frame 1F, the third TFT T3 may be deteriorated. To improve the above deterioration, the third TFT T3 for maintaining the Q node voltage may be substituted with a resistor.

Figure 11:
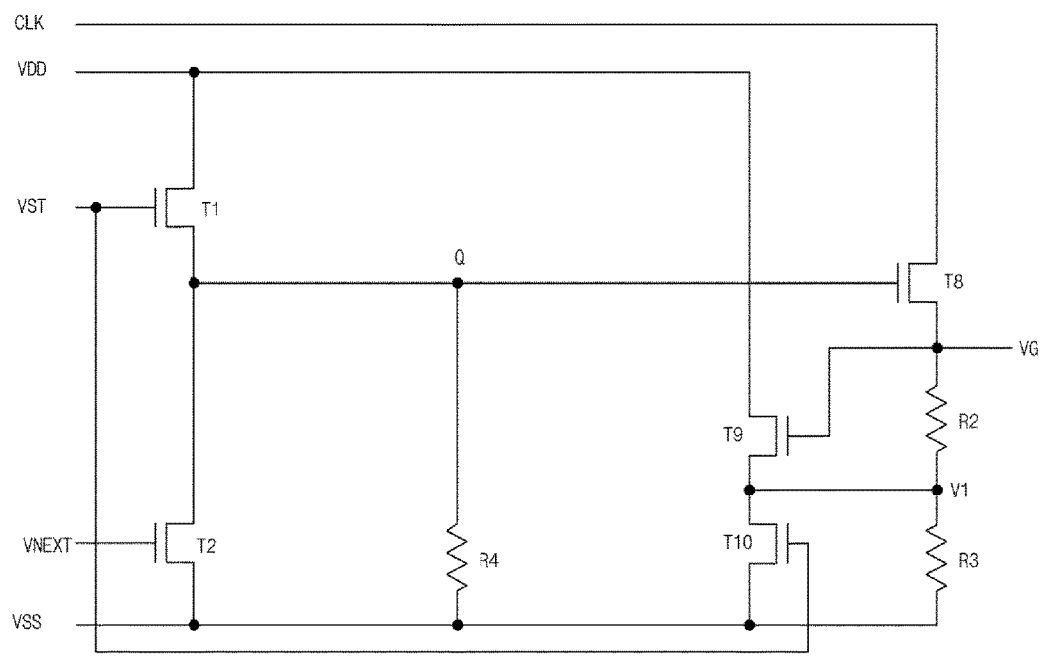
FIG. 11 is a view showing one stage of a shift register according to a third embodiment of the present disclosure.
Figure 12:
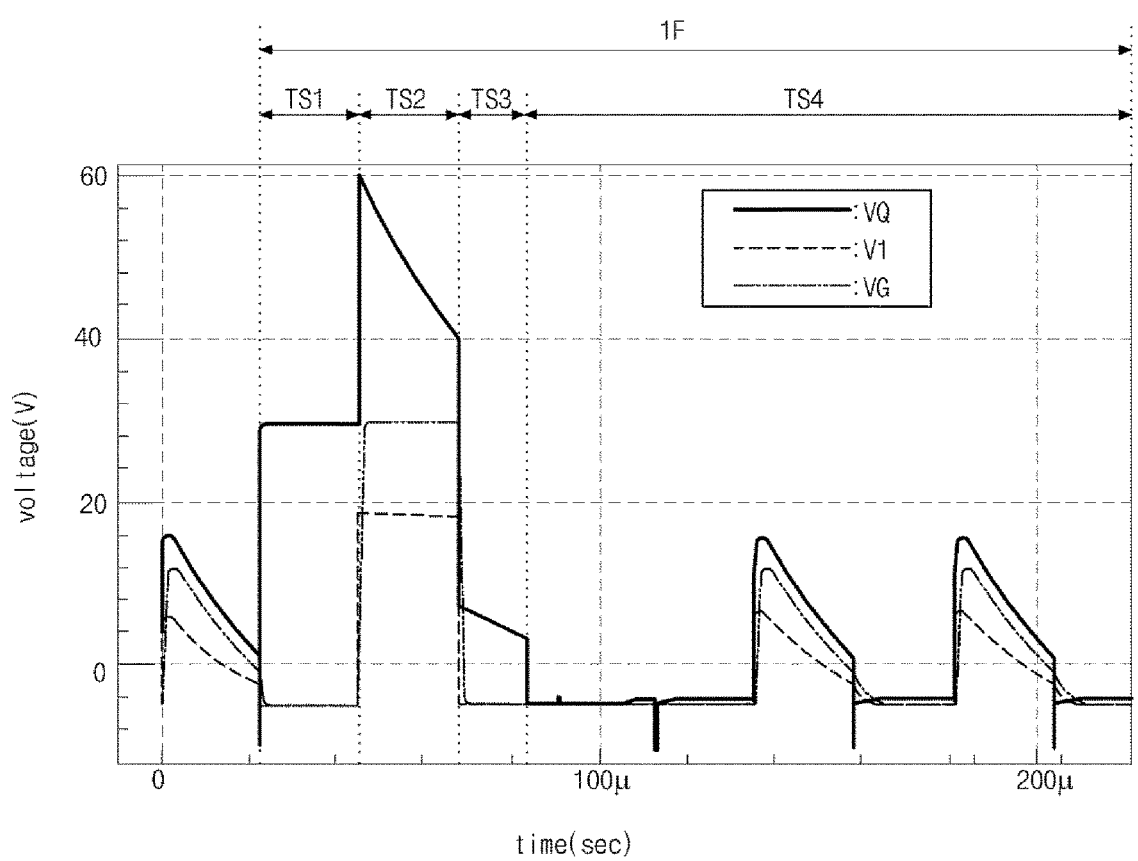
FIG. 12 is a view showing a Q node voltage, a first voltage and a gate voltage of a shift register according to a third embodiment of the present disclosure.

FIG. 11 is a view showing one stage of a shift register according to a third embodiment of the present disclosure, and FIG. 12 is a view showing a Q node voltage, a first voltage and a gate voltage of a shift register according to a third embodiment of the present disclosure. Illustrations for parts the same as those of the second embodiment will be omitted.

In FIG. 11, a shift register of a gate driving unit of a GIP type display device according to a third embodiment of the present disclosure generates a gate voltage VG supplied to a display panel using a high level power voltage VDD, a low level power voltage VSS, a start voltage VST, a next stage gate voltage VNEXT and a clock CLK. Each stage SRS of the shift register includes first, second and eighth to tenth thin film transistors (TFTs) T1, T2 and T8 to T10 and second to fourth resistors R2 to R4.

The connections between the first, second and eighth to tenth TFTs T1, T2 and T8 to T10 are the same as those of the second embodiment. A first end of the fourth resistor R4 is connected to the Q node, and a second end of the fourth resistor R4 is connected to the low level power voltage VSS. The start voltage VST may be applied to the first stage, and a previous stage gate voltage may be applied to the second to nth stages.

In the stage SRS of the shift register, the gate voltage VG is outputted from a node between the source of the eighth TFT T8 and the second resistor R2. A high level voltage of the clock CLK is outputted as the gate voltage VG (VGH) while the eighth TFT T8 is turned on, and a voltage higher than the low level power voltage VSS by a voltage rise in the second and third resistors R2 and R3 (VSS+IR2+IR3) is outputted as the gate voltage VG (VGL) while the eighth TFT T8 is turned off. Accordingly, in each stage SRS of the shift register according to a third embodiment of the present disclosure, the eighth TFT T8 as a pull-up TFT outputs the gate voltage VG of a high level voltage, while a pull-down TFT is omitted and the second and third resistors R2 and R3 output the gate voltage VG of a low level voltage.

In each stage SRS of the shift register, since a pull-down TFT which is turned on for most of one frame 1F is omitted, an abnormal operation of the shift register due to deterioration of the pull-down TFT for the gate voltage VG is prevented and reliability of the gate driving circuit is improved.

In addition, since the ninth TFT T9 is turned on while the eighth TFT T8 is turned on to output high level voltage as the gate voltage VG, the first voltage V1 of the first node between the second and third resistors R2 and R3 rises up to the high level power voltage VDD. As a result, voltage drop of the gate voltage VG is prevented and reliability of the gate driving circuit is further improved.

Further, when the eighth TFT T8 is turned off and the gate voltage VG is changed from a high level voltage to a low level voltage, the ninth TFT T9 is turned off and the tenth TFT T10 is turned on. Accordingly, the gate voltage VG reaches the low level voltage faster and the stage SRS of the shift register outputs the gate voltage more stably.

Moreover, since a pull-down TFT for the Q node which is turned on for most of one frame 1F and TFTs for driving the pull-down TFT for the Q node are omitted, the number of the TFTs is minimized. As a result, a degree of integration of the shift register in the display panel is improved.

In FIG. 12, during a first time section TS1, since a high level voltage is applied to the Q node and the gate of the eighth TFT T8 to turn on the eighth TFT T8, a low level voltage of the clock CLK is outputted as the gate voltage VG. During a second time section TS2, since a high level voltage of the clock CLK is applied to the drain of the eighth TFT T8 and the high level voltage of the gate of the eighth TFT T8 becomes a higher level voltage by boosting to turn on the eighth TFT T8, the high level voltage of the clock CLK is outputted as the gate voltage VG. In addition, since the high level voltage is applied to the gate of the ninth TFT T9 to turn on the ninth TFT T9, the first voltage V1 of the first node between the second and third resistors R2 and R3 becomes the high level power voltage VDD.

During a third time section TS3, since a high level voltage is applied to the Q node and the gate of the eighth TFT T8 to turn on the eighth TFT T8, the low level voltage of the clock CLK is outputted as the gate voltage VG. In addition, since the next stage gate voltage VNEXT is applied to the gate of the tenth TFT T10 to turn on the tenth TFT T10, the first voltage V1 becomes the low level power voltage VSS.

During a fourth time section TS4, since a low level voltage is applied to the Q node and the gate of the eighth TFT T8 to turn off the eighth TFT T8, the Q node maintains the low level power voltage VSS due to the fourth resistor R4.

In the shift register according to a third embodiment of the present disclosure, when the fourth resistor R4 has a relatively low resistance, the Q node does not maintain a high level voltage for a sufficient time period and a turn-on period of the eighth TFT T8 becomes short. In addition, when the fourth resistor R4 has a relatively high resistance, the Q node does not maintain a sufficiently low level voltage and the eighth TFT T8 is not turned off stably. As a result, the shift register may have an unstable output. To improve the unstable output of the shift register, the Q node voltage may be maintained by adding a TFT, a capacitor and a resistor.

Figure 13:
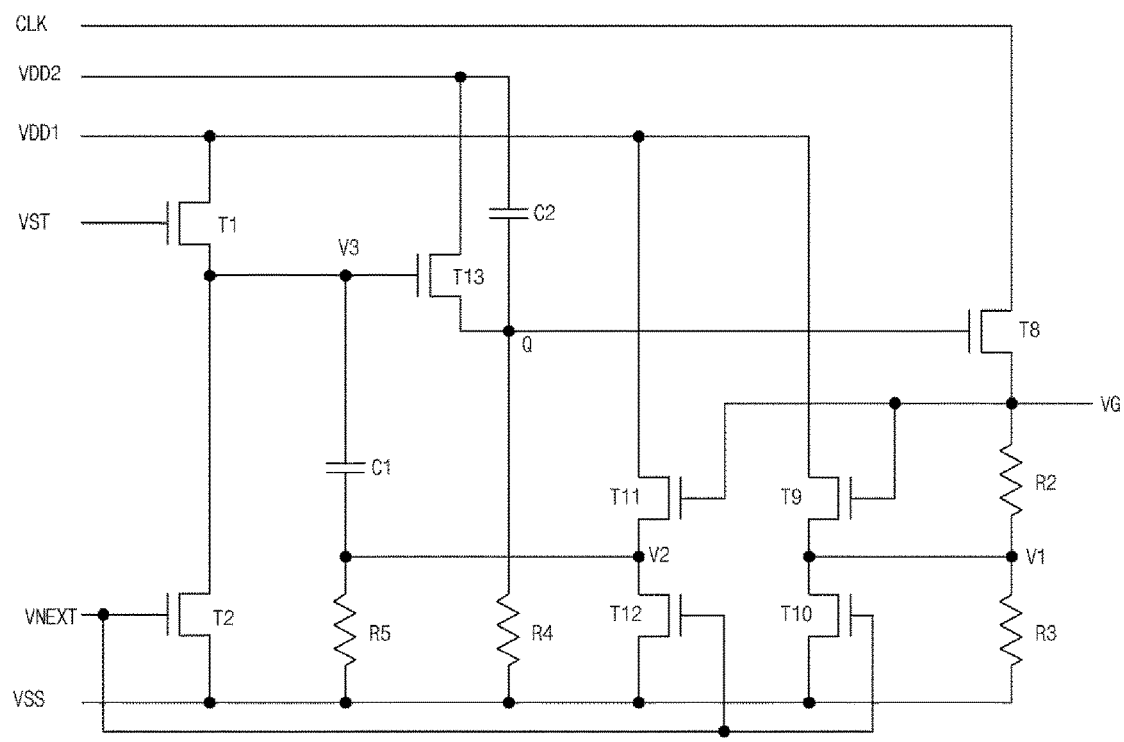
FIG. 13 is a view showing one stage of a shift register according to a fourth embodiment of the present disclosure.
Figure 14:
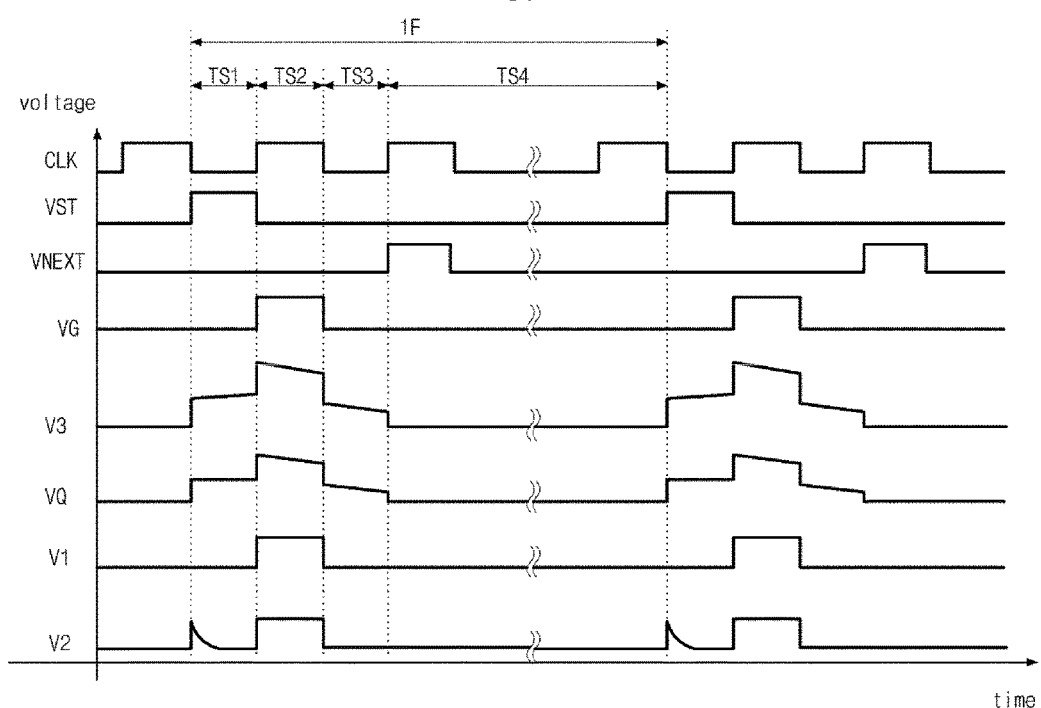
FIG. 14 is a timing chart showing a plurality of signals for a shift register of a gate-in-panel type display device according to a fourth embodiment of the present disclosure.
Figure 15:
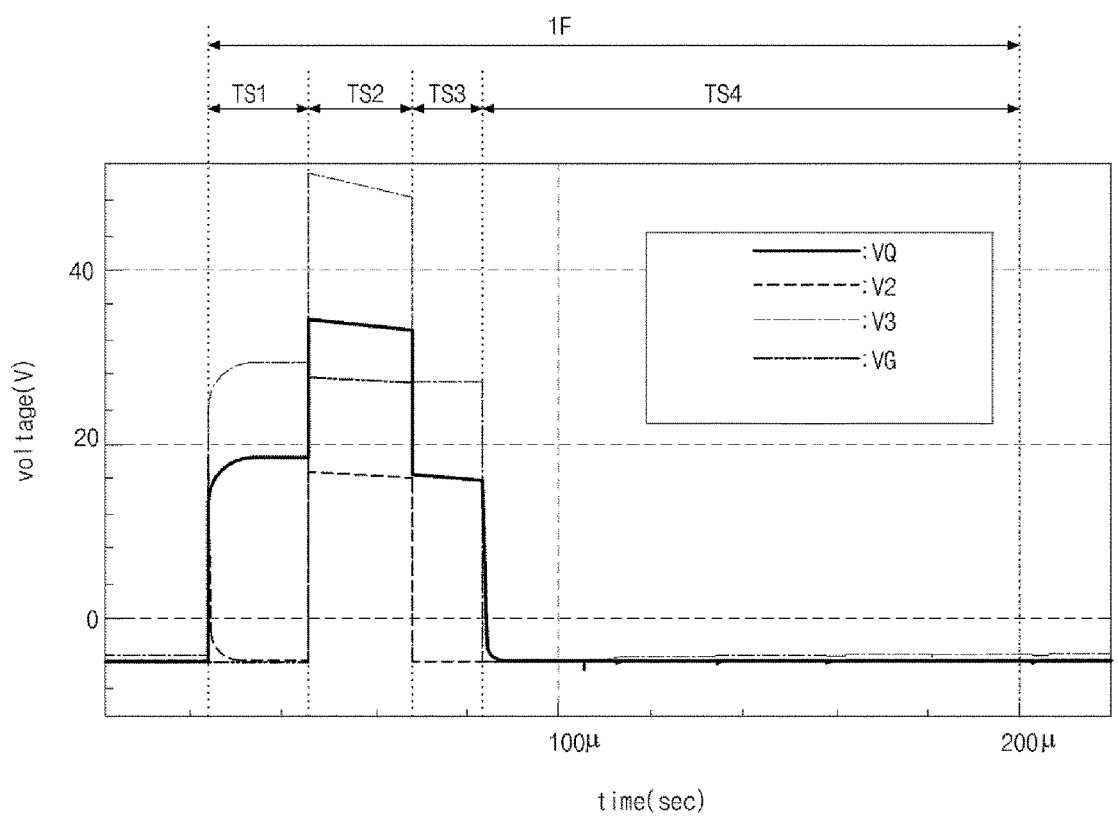
FIG. 15 is a view showing a Q node voltage, second and third voltages and a gate voltage of a shift register according to a fourth embodiment of the present disclosure.

FIG. 13 is a view showing one stage of a shift register according to a fourth embodiment of the present disclosure, FIG. 14 is a timing chart showing a plurality of signals for a shift register of a gate-in-panel type display device according to a fourth embodiment of the present disclosure, and FIG. 15 is a view showing a Q node voltage, second and third voltages and a gate voltage of a shift register according to a fourth embodiment of the present disclosure. Illustrations for parts the same as those of the third embodiment will be omitted.

In FIG. 13, a shift register of a gate driving unit of a GIP type display device according to a fourth embodiment of the present disclosure generates a gate voltage VG supplied to a display panel using first and second high level power voltages VDD1 and VDD2, a low level power voltage VSS, a start voltage VST, a next stage gate voltage VNEXT and a clock CLK. Each stage SRS of the shift register includes first, second and eighth to thirteenth thin film transistors (TFTs) T1, T2 and T8 to T13, second to fifth resistors R2 to R5 and first and second capacitors C1 and C2.

The connections between the first, second, eighth to tenth TFTs T1, T2 and T8 to T10 and the second to fourth resistors R2 to R4 are the same as those of the third embodiment except that the high level power voltage VDD of the third embodiment is substituted with the first high level power voltage VDD1 in the fourth embodiment.

The first high level power voltage VDD1 is applied to the drain of the eleventh TFT T11, the gate of the eleventh TFT T11 is connected to the source of the eighth TFT T8 and the first end of the second resistor R2, and the source of the eleventh TFT T11 is connected to the drain of the twelfth TFT T12 and the first end of the fifth resistor R5.

The next stage gate voltage VNEXT is applied to the gate and the source of the twelfth TFT T12, and the drain of the twelfth TFT T12 is connected to the source of the eleventh TFT T11 and the first end of the fifth resistor R5.

The second high level power voltage VDD2 is applied to the drain of the thirteenth TFT T13, the gate of the thirteenth TFT T13 is connected to the source of the first TFT T1, the drain of the second TFT T2 and the first end of the first capacitor C1, and the source of the thirteenth TFT T13 is connected to the Q node, the second end of the second capacitor C2, the first end of the fourth resistor R4 and the gate of the eighth TFT T8.

A first end of the fifth resistor R5 is connected to the second end of the first capacitor C1, the source of the eleventh TFT T11 and the drain of the twelfth TFT T12, and a second end of the fifth resistor R5 is connected to the low level power voltage VSS.

The first end of the first capacitor C1 is connected the source of the first TFT T1, the drain of the second TFT T2 and the gate of the thirteenth TFT T13, and the second end of the first capacitor C1 is connected to the first end of the fifth resistor R5, the source of the eleventh TFT T11 and the drain of the twelfth TFT T12.

The second high level power voltage VDD2 is applied to the first end of the second capacitor C2, and the second end of the second capacitor C2 is connected to the Q node, the source of the thirteenth TFT T13, the first end of the fourth resistor R4 and the gate of the eighth TFT T8.

The start voltage VST may be applied to the first stage, and a previous stage gate voltage may be applied to the second to nth stages. In addition, the second high level power voltage VDD2 may be higher than the first high level power voltage VDD1. For example, the low level power voltage VSS, the first high level power voltage VDD1 and the second high level power voltage VDD2 may be about −5V, about 30V and about 50V, respectively.

In the stage SRS of the shift register, the gate voltage VG is outputted from a node between the source of the eighth TFT T8 and the second resistor R2. A high level voltage of the clock CLK is outputted as the gate voltage VG (VGH) while the eighth TFT T8 is turned on, and a voltage higher than the low level power voltage VSS by a voltage rise in the second and third resistors R2 and R3 (VSS+IR2+IR3) is outputted as the gate voltage VG (VGL) while the eighth TFT T8 is turned off. Accordingly, in each stage SRS of the shift register according to a fourth embodiment of the present disclosure, the eighth TFT T8 as a pull-up TFT outputs the gate voltage VG of a high level voltage, while a pull-down TFT is omitted and the second and third resistors R2 and R3 output the gate voltage VG of a low level voltage.

In each stage SRS of the shift register, since a pull-down TFT which is turned on for most of one frame 1F is omitted, an abnormal operation of the shift register due to deterioration of the pull-down TFT for the gate voltage VG is prevented and reliability of the gate driving circuit is improved.

In addition, since the ninth TFT T9 is turned on while the eighth TFT T8 is turned on to output high level voltage as the gate voltage VG, the first voltage V1 of the first node between the second and third resistors R2 and R3 rises up to the first high level power voltage VDD1. As a result, voltage drop of the gate voltage VG is prevented and reliability of the gate driving circuit is further improved.

Further, when the eighth TFT T8 is turned off and the gate voltage VG is changed from a high level voltage to a low level voltage, the ninth TFT T9 is turned off and the tenth TFT T10 is turned on. Accordingly, the gate voltage VG reaches the low level voltage faster and the stage SRS of the shift register outputs the gate voltage more stably.

Moreover, since a pull-down TFT for the Q node which is turned on for most of one frame 1F and TFTs for driving the pull-down TFT for the Q node are omitted, the number of the TFTs is minimized. As a result, a degree of integration of the shift register in the display panel is improved.

Furthermore, since the second high level power voltage VDD2 higher than the first high level power voltage VDD1 is applied to the Q node, the eighth TFT T8 is turned on for a sufficient time period to output the gate voltage VG of a high level voltage. Here, the second high level power voltage VDD2 is applied to the drain of the thirteenth TFT T13 and the third voltage V3 of the third node which is the gate of the thirteenth TFT T13 becomes higher than the second high level power voltage VDD2 by charge pumping through the first capacitor C1 to turn on the thirteenth TFT T13. The application time period of the second high level power voltage VDD2 may be adjusted by using the eleventh and twelfth TFTs T11 and T12.

In addition, since a ripple (voltage change) of the gate voltage VG due to the clock CLK is prevented by using the second capacitor C2 while the eighth TFT T8 is turned off, the gate voltage VG of a low level voltage is stably outputted.

In FIGS. 14 and 15, during a first time section TS1, the third voltage V3 of the third node of the gate of the thirteenth TFT T13 becomes a high level voltage to turn on the thirteenth TFT T13. As a result, since the second high level power voltage VDD2 is applied to the Q node and the gate of the eighth TFT T8 to turn on the eighth TFT T8, the low level voltage of the clock CLK is outputted as the gate voltage VG.

During a second time section TS2, the third voltage V3 of the third node which is the gate of the thirteenth TFT T13 becomes a higher level voltage by charge pumping through the first capacitor C1 to turn on the thirteenth TFT T13.

In addition, since a high level voltage of the clock CLK is applied to the drain of the eighth TFT T8 and the high level voltage of the gate of the eighth TFT T8 becomes a higher level voltage by boosting to turn on the eighth TFT T8, the high level voltage of the clock CLK is outputted as the gate voltage VG.

Here, the high level voltage is applied to the gate of the ninth and eleventh TFTs T9 and T11 to turn on the ninth and eleventh TFTs T9 and T11. As a result, the first voltage V1 of the first node between the second and third resistors R2 and R3 becomes the first high level power voltage VDD1 to prevent voltage drop of the gate voltage VG, and the second voltage V2 of the second node of the second end of the first capacitor C1 becomes the first high level power voltage VDD1 to prevent voltage drop of the third voltage V3.

During a third time section TS3, since a high level voltage is applied to the Q node and the gate of the eighth TFT T8 to turn on the eighth TFT T8, the low level voltage of the clock CLK is outputted as the gate voltage VG. In addition, the next stage gate voltage VNEXT is applied to the gate of the tenth and twelfth TFTs T10 and T12 to turn on the tenth and twelfth TFTs T10 and T12. As a result, the first voltage V1 becomes the low level power voltage VSS to make the gate voltage VG a low level voltage promptly, and the second voltage V2 becomes the low level power voltage VSS to make the third voltage V3 a low level voltage promptly.

During a fourth time section TS4, since a low level voltage is applied to the Q node and the gate of the eighth TFT T8 to turn off the eighth TFT T8, the Q node maintains the low level power voltage VSS due to the fourth resistor R4. Here, since the Q node stably maintains the low level voltage using the second capacitor C2, a ripple (voltage change) of the gate voltage VG of the low level voltage is prevented.

In another embodiment, a falling time of the gate voltage may be reduced and an under-driving method for improving display quality may be applied by changing the gate voltage from a high level voltage to a lower level voltage.

Figure 16:
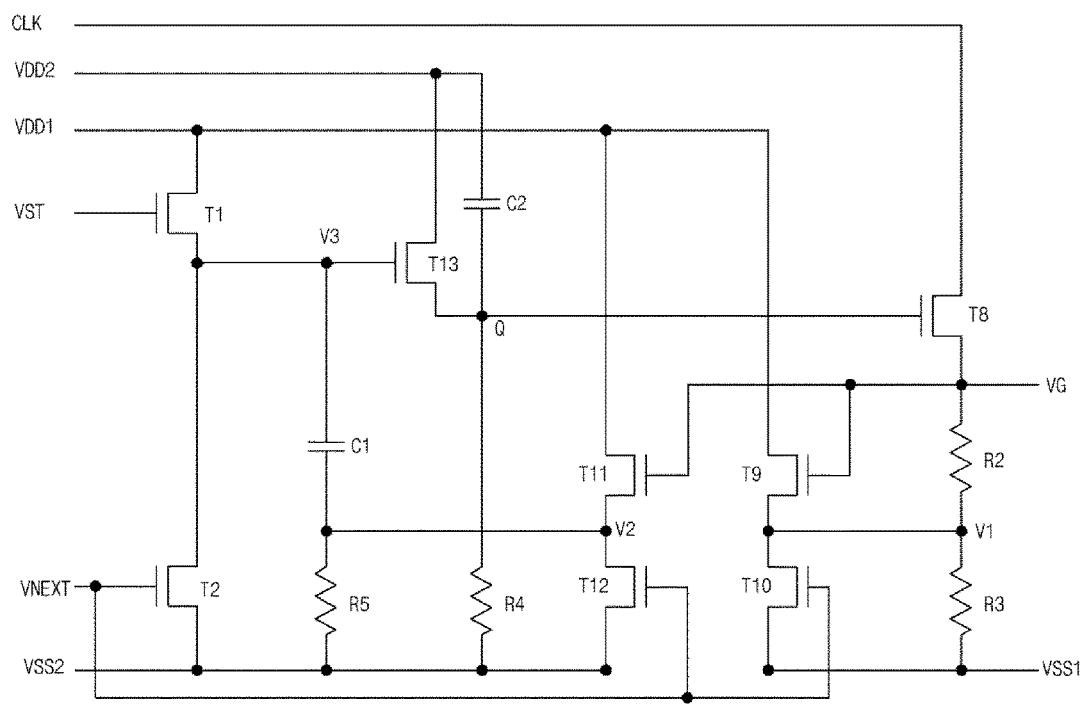
FIG. 16 is a view showing one stage of a shift register according to a fifth embodiment of the present disclosure.
Figure 17:
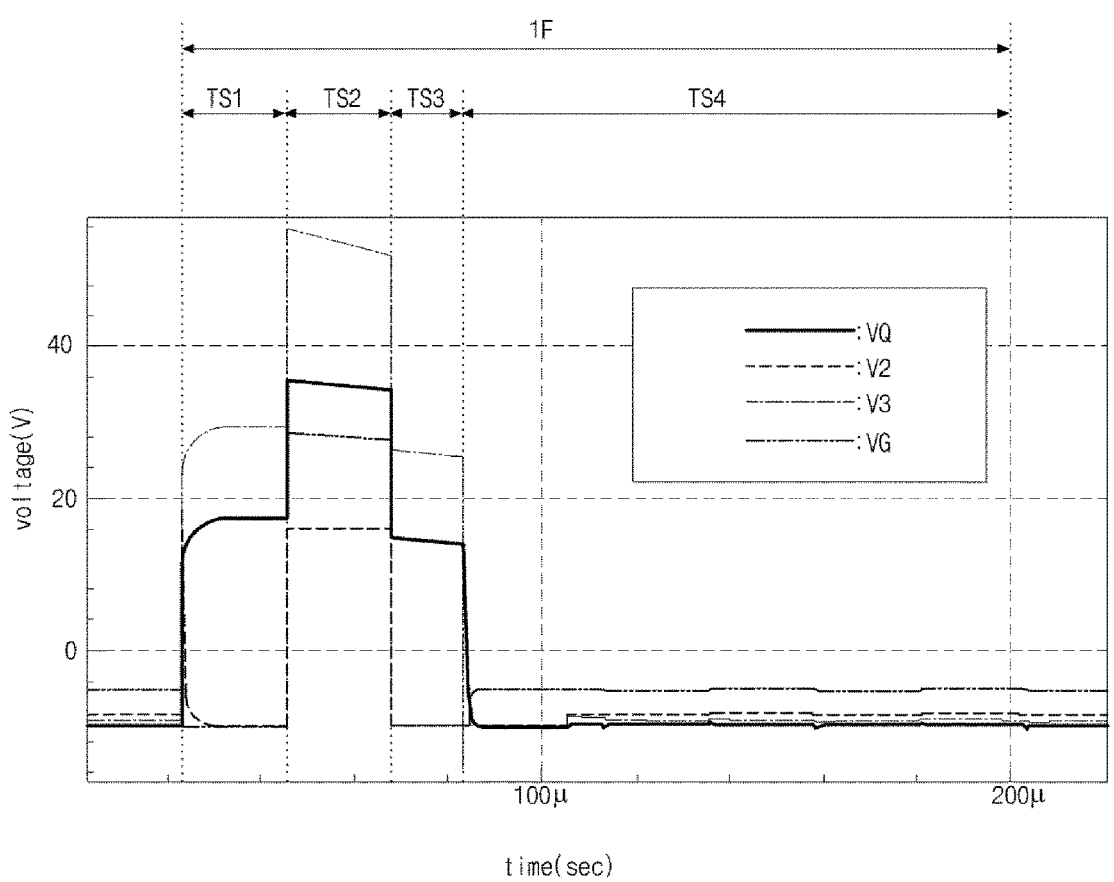
FIG. 17 is a view showing a Q node voltage, second and third voltages and a gate voltage of a shift register according to a fifth embodiment of the present disclosure.

FIG. 16 is a view showing one stage of a shift register according to a fifth embodiment of the present disclosure, and FIG. 17 is a view showing a Q node voltage, second and third voltages and a gate voltage of a shift register according to a fifth embodiment of the present disclosure. Illustrations for parts the same as those of the fourth embodiment will be omitted.

In FIG. 16, a shift register of a gate driving unit of a GIP type display device according to a fifth embodiment of the present disclosure generates a gate voltage VG supplied to a display panel using first and second high level power voltages VDD1 and VDD2, first and second low level power voltages VSS1 and VSS2, a start voltage VST, a next stage gate voltage VNEXT and a clock CLK. Each stage SRS of the shift register includes first, second and eighth to thirteenth thin film transistors (TFTs) T1, T2 and T8 to T13, second to fifth resistors R2 to R5 and first and second capacitors C1 and C2.

The connections between the first, second, eighth to thirteenth TFTs T1, T2 and T8 to T13, the second to fifth resistors R2 to R5 and the first and second capacitors C1 and C2 are the same as those of the fourth embodiment except that the low level power voltage VSS of the fourth embodiment is divided into the first and second low level power voltages VSS1 and VSS2 in the fifth embodiment.

The first low level power voltage VSS1 is applied to the source of the tenth TFT T10 and the second end of the third resistor R3, and the second low level power voltage VSS2 is applied to the sources of the second and twelfth TFTs T2 and T12 and the second ends of the fourth and fifth resistors R4 and R5.

The start voltage VST may be applied to the first stage, and a previous stage gate voltage may be applied to the second to nth stages. In addition, the second high level power voltage VDD2 may be higher than the first high level power voltage VDD1, and the second low level power voltage VSS2 may be lower than the first low level power voltage VSS1.

In the stage SRS of the shift register, the gate voltage VG is outputted from a node between the source of the eighth TFT T8 and the second resistor R2. A high level voltage of the clock CLK is outputted as the gate voltage VG (VGH) while the eighth TFT T8 is turned on, and a voltage higher than the first low level power voltage VSS1 by a voltage rise in the second and third resistors R2 and R3 (VSS1+IR2+ IR3) is outputted as the gate voltage VG (VGL) while the eighth TFT T8 is turned off. Accordingly, in each stage SRS of the shift register according to a fifth embodiment of the present disclosure, the eighth TFT T8 as a pull-up TFT outputs the gate voltage VG of a high level voltage, while a pull-down TFT is omitted and the second and third resistors R2 and R3 output the gate voltage VG of a low level voltage.

In each stage SRS of the shift register, since a pull-down TFT which is turned on for most of one frame 1F is omitted, an abnormal operation of the shift register due to deterioration of the pull-down TFT for the gate voltage VG is prevented and reliability of the gate driving circuit is improved.

In addition, since the ninth TFT T9 is turned on while the eighth TFT T8 is turned on to output high level voltage as the gate voltage VG, the first voltage V1 of the first node between the second and third resistors R2 and R3 rises up to the first high level power voltage VDD1. As a result, voltage drop of the gate voltage VG is prevented and reliability of the gate driving circuit is further improved.

Further, when the eighth TFT T8 is turned off and the gate voltage VG is changed from a high level voltage to a low level voltage, the ninth TFT T9 is turned off and the tenth TFT T10 is turned on. Accordingly, the gate voltage VG reaches the low level voltage faster and the stage SRS of the shift register outputs the gate voltage more stably.

Moreover, since a pull-down TFT for the Q node which is turned on for most of one frame 1F and TFTs for driving the pull-down TFT for the Q node are omitted, the number of the TFTs is minimized. As a result, a degree of integration of the shift register in the display panel is improved.

Furthermore, since the second high level power voltage VDD2 higher than the first high level power voltage VDD1 is applied to the Q node, the eighth TFT T8 is turned on for a sufficient time period to output the gate voltage VG of a high level voltage. Here, the second high level power voltage VDD2 is applied to the drain of the thirteenth TFT T13 and the third voltage V3 of the third node which is the gate of the thirteenth TFT T13 becomes higher than the second high level power voltage VDD2 by charge pumping through the first capacitor C1 to turn on the thirteenth TFT T13. The application time period of the second high level power voltage VDD2 may be adjusted by using the eleventh and twelfth TFTs T11 and T12.

In addition, since a ripple (voltage change) of the gate voltage VG due to the clock CLK is prevented by using the second capacitor C2 while the eighth TFT T8 is turned off, the gate voltage VG of a low level voltage is stably outputted.

Further, while the eighth TFT T8 is turned on before the gate voltage VG of a high level voltage is outputted, the second low level power voltage VSS2 which is the low level voltage of the clock CLK is outputted as the gate voltage VG. While the eighth TFT T8 is turned off after the gate voltage VG of a high level voltage is outputted, the first low level power voltage VSS1 is outputted as the gate voltage VG. As a result, a falling time of the gate voltage VG is reduced (under-driving).

In FIG. 17, during a first time section TS1, since the third voltage V3 of the third node of the gate of the thirteenth TFT T13 becomes a high level voltage to turn on the thirteenth TFT T13. As a result, since the second high level power voltage VDD2 is applied to the Q node and the gate of the eighth TFT T8 to turn on the eighth TFT T8, the second low level power voltage VSS2 which is the low level voltage of the clock CLK is outputted as the gate voltage VG.

During a second time section TS2, the third voltage V3 of the third node which is the gate of the thirteenth TFT T13 becomes a higher level voltage by charge pumping through the first capacitor C1 to turn on the thirteenth TFT T13.

In addition, since a high level voltage of the clock CLK is applied to the drain of the eighth TFT T8 and the high level voltage of the gate of the eighth TFT T8 becomes a higher level voltage by boosting to turn on the eighth TFT T8, the high level voltage of the clock CLK is outputted as the gate voltage VG.

Here, the high level voltage is applied to the gate of the ninth and eleventh TFTs T9 and T11 to turn on the ninth and eleventh TFTs T9 and T11. As a result, the first voltage V1 of the first node between the second and third resistors R2 and R3 becomes the first high level power voltage VDD1 to prevent voltage drop of the gate voltage VG, and the second voltage V2 of the second node of the second end of the first capacitor C1 becomes the first high level power voltage VDD1 to prevent voltage drop of the third voltage V3.

During a third time section TS3, since a high level voltage is applied to the Q node and the gate of the eighth TFT T8 to turn on the eighth TFT T8, the second low level power voltage VSS2 which is the low level voltage of the clock CLK is outputted as the gate voltage VG. In addition, the next stage gate voltage VNEXT is applied to the gate of the tenth and twelfth TFTs T10 and T12 to turn on the tenth and twelfth TFTs T10 and T12. As a result, the first voltage V1 becomes the first low level power voltage VSS1 to make the gate voltage VG a low level voltage promptly, and the second voltage V2 becomes the second low level power voltage VSS2 to make the third voltage V3 a low level voltage promptly.

During a fourth time section TS4, since a low level voltage is applied to the Q node and the gate of the eighth TFT T8 to turn off the eighth TFT T8, the Q node maintains the second low level power voltage VSS2 due to the fourth resistor R4. Here, since the Q node stably maintains the low level voltage using the second capacitor C2, a ripple (voltage change) of the gate voltage VG of the low level voltage is prevented. Further, the first low level power voltage VSS1 is outputted as the gate voltage VG by the second resistor R2.

Consequently, in a gate driving circuit according to an embodiment of the present disclosure, since a pull-down TFT of a stage of a shift register is substituted with a resistor, deterioration of the TFT is prevented and reliability of the shift register is improved.

In addition, since a pull-down TFT of a stage of a shift register is substituted with a resistor, a TFT and a capacitor, deterioration of the TFT is prevented, a gate voltage is stably outputted, and reliability of the shift register is improved.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A gate driving circuit sequentially outputting a gate voltage using a high level power voltage, a low level power voltage, a start voltage, a previous stage gate voltage, a next stage gate voltage, and a clock, comprising:
a shift register including a plurality of stages connected to each other by a cascade connection, each of the plurality of stages comprising:
a first thin film transistor (TFT) switched by the start voltage or the previous stage gate voltage and transmitting the high level power voltage to a Q node;
a second TFT switched by the next stage gate voltage and transmitting the low level power voltage to the Q node;
a third TFT switched by a voltage of the Q node and transmitting the clock to an output node;
a fourth TFT including a gate electrode that is connected to the output node;
a first resistor including a first end and a second end, the first end of the first resistor connected to the output node, the gate electrode of the fourth TFT, and an electrode of the third TFT, and the second end of the first resistor connected to the low level power voltage,
wherein the output node is located at a connection between the electrode of the third TFT, the gate electrode of the fourth TFT, and the first end of the first resistor.

2. The gate driving circuit of claim 1, wherein each of the plurality of stages further comprises:
  a fifth TFT switched by a voltage of a QB node and transmitting the low level power voltage to the Q node;
  a sixth TFT switched by the next stage gate voltage and transmitting the high level power voltage to the QB node;
  a seventh TFT switched by the voltage of the Q node and transmitting the low level power voltage to the QB node;
  an eighth TFT switched by the high level power voltage and transmitting the high level power voltage to the QB node; and
  a ninth TFT switched by the previous stage gate voltage and transmitting the low level power voltage to the QB node.

3. The gate driving circuit of claim 1, wherein each of the plurality of stages further comprises:
  a second resistor connected between the first resistor and the low level power voltage;
  a third resistor connected between the Q node and the low level power voltage;
  wherein the fourth TFT is switched by a voltage of the output node and transmitting the high level power voltage to a first node between the first and second resistors; and
  a fifth TFT switched by the next stage gate voltage and transmitting the low level power voltage to the first node.

4. The gate driving circuit of claim 3, wherein each of the plurality of stages further comprises:
  a sixth TFT switched by the voltage of the output node and transmitting the high level power voltage to a second node;
  a seventh TFT switched by the next stage gate voltage and transmitting the low level power voltage to the second node;
  an eighth TFT switched by a voltage of a third node between the first and second TFTs and transmitting the high level power voltage to the Q node;
  a fourth resistor connected between the second node and the low level power voltage;
  a first capacitor connected between the second and third nodes; and
  a second capacitor connected between the high level power voltage and the Q node,
  wherein the high level power voltage includes a first high level power voltage and a second high level power voltage higher than the first high level power voltage,
  wherein the first high level power voltage is applied to the first, third, fourth and sixth TFTs and the first capacitor, and
  wherein the second high level power voltage is applied to the eighth TFT and the second capacitor.

5. The gate driving circuit of claim 4, wherein the low level power voltage includes a first low level power voltage and a second low level power voltage lower than the first low level power voltage,
  wherein the first low level power voltage is applied to the fifth TFT and the second resistor, and
  wherein the second low level power voltage is applied to the second and seventh TFTs and the third and fourth resistors.

6. A gate driving circuit sequentially outputting a gate voltage using a high level power voltage, a low level power voltage, a start voltage, a previous stage gate voltage, a next stage gate voltage and a clock, comprising: a shift register including a plurality of stages connected to each other by a cascade connection, each of the plurality of stages comprising:
  a first thin film transistor (TFT) switched by the start voltage or the previous stage gate voltage and transmitting the high level power voltage to a Q node;
  a second TFT switched by the next stage gate voltage and transmitting the low level power voltage to the Q node;
  a third TFT switched by a voltage of the Q node and transmitting the clock to an output node;
  a first resistor connected between the output node and the low level power voltage;
  a second resistor connected between the first resistor and the low level power voltage;
  a fourth TFT switched by a voltage of the output node and transmitting the high level power voltage to a first node between the first and second resistors; and
  a fifth TFT switched by the next stage gate voltage and transmitting the low level power voltage to the first node.

7. A display device comprising:
  a timing controlling unit generating a gate control signal, a data control signal and an image data;
  a data driving unit generating a data voltage using the data control signal and the image data;
  a gate driving unit generating a gate voltage using the gate control signal; and
  a display panel displaying an image using the gate voltage and the data voltage,
  wherein the gate driving unit sequentially outputting the gate voltage using a high level power voltage, a low level power voltage, a start voltage, a previous stage gate voltage, a next stage gate voltage, and a clock,
  wherein the gate driving unit comprises a shift register including a plurality of stages connected to each other by a cascade connection,
  wherein each of the plurality of stages comprises:
    a first thin film transistor (TFT) switched by the start voltage or the previous stage gate voltage and transmitting the high level power voltage to a Q node;
    a second TFT switched by the next stage gate voltage and transmitting the low level power voltage to the Q node;
    a third TFT switched by a voltage of the Q node and transmitting the clock to an output node;
    a fourth TFT including a gate electrode that is connected to the output node;
    a first resistor including a first end and a second end, the first end of the first resistor connected to the output node, the gate electrode of the fourth TFT, and an electrode of the third TFT, and the second end of the first resistor connected to the low level power voltage,
    wherein the output node is located at a connection between the electrode of the third TFT, the gate electrode of the fourth TFT, and the first end of the first resistor.

8. The display device of claim 7, wherein each of the plurality of stages further comprises:
  a fifth TFT switched by a voltage of a QB node and transmitting the low level power voltage to the Q node;
  a sixth TFT switched by the next stage gate voltage and transmitting the high level power voltage to the QB node;
  a seventh TFT switched by the voltage of the Q node and transmitting the low level power voltage to the QB node;

an eighth TFT switched by the high level power voltage and transmitting the high level power voltage to the QB node; and a ninth TFT switched by the previous stage gate voltage and transmitting the low level power voltage to the QB node.

9. The display device of claim 7, wherein each of the plurality of stages further comprises:
a second resistor connected between the first resistor and the low level power voltage;
a third resistor connected between the Q node and the low level power voltage;
a fourth TFT switched by a voltage of the output node and transmitting the high level power voltage to a first node between the first and second resistors; and
a fifth TFT switched by the next stage gate voltage and transmitting the low level power voltage to the first node.

10. The display device of claim 9, wherein each of the plurality of stages further comprises:
a sixth TFT switched by the voltage of the output node and transmitting the high level power voltage to a second node;
a seventh TFT switched by the next stage gate voltage and transmitting the low level power voltage to the second node;
an eighth TFT switched by a voltage of a third node between the first and second TFTs and transmitting the high level power voltage to the Q node;
a fourth resistor connected between the second node and the low level power voltage;
a first capacitor connected between the second and third nodes; and
a second capacitor connected between the high level power voltage and the Q node,
wherein the high level power voltage includes a first high level power voltage and a second high level power voltage higher than the first high level power voltage,
wherein the first high level power voltage is applied to the first, third, fourth and sixth TFTs and the first capacitor, and
wherein the second high level power voltage is applied to the eighth TFT and the second capacitor.

11. The display device of claim 10, wherein the low level power voltage includes a first low level power voltage and a second low level power voltage lower than the first low level power voltage,
wherein the first low level power voltage is applied to the fifth TFT and the second resistor, and
wherein the second low level power voltage is applied to the second and seventh TFTs and the third and fourth resistors.

12. A display device comprising:
a timing controlling unit generating a gate control signal, a data control signal and an image data;
a data driving unit generating a data voltage using the data control signal and the image data;
a gate driving unit generating a gate voltage using the gate control signal; and
a display panel displaying an image using the gate voltage and the data voltage,
wherein the gate driving unit sequentially outputting the gate voltage using a high level power voltage, a low level power voltage, a start voltage, a previous stage gate voltage, a next stage gate voltage and a clock,
wherein the gate driving unit comprises a shift register including a plurality of stages connected to each other by a cascade connection,
wherein each of the plurality of stages comprises:
a first thin film transistor (TFT) switched by the start voltage or the previous stage gate voltage and transmitting the high level power voltage to a Q node;
a second TFT switched by the next stage gate voltage and transmitting the low level power voltage to the Q node;
a third TFT switched by a voltage of the Q node and transmitting the clock to an output node;
a first resistor connected between the output node and the low level power voltage;
a second resistor connected between the first resistor and the low level power voltage;
a fourth TFT switched by a voltage of the output node and transmitting the high level power voltage to a first node between the first and second resistors; and
a fifth TFT switched by the next stage gate voltage and transmitting the low level power voltage to the first node.

13. A gate driving circuit sequentially outputting a gate voltage using a high level power voltage, a low level power voltage, a start voltage, a previous stage gate voltage, a next stage gate voltage, a clock, and a ground voltage, comprising:
a shift register including a plurality of stages connected to each other by a cascade connection, each of the plurality of stages comprising:
a first thin film transistor (TFT) switched by the start voltage or the previous stage gate voltage and transmitting the high level power voltage to a Q node;
a second TFT switched by the next stage gate voltage and transmitting the low level power voltage to the Q node;
a third TFT switched by a voltage of the Q node and transmitting the clock to an output node; and
a first discrete resistor including a first end and a second end, the first end of the first discrete resistor connected to the output node and an electrode of the third TFT, and
a second discrete resistor including a first end and a second end, the first end of the second discrete resistor directly connected to the second end of the first discrete resistor, and the second end of the second discrete resistor connected to the low level power voltage;
wherein the output node is located at a connection between the electrode of the third TFT and the first end of the first discrete resistor.

* * * * *